United States Patent
Meijer et al.

(10) Patent No.: US 8,552,734 B2
(45) Date of Patent: Oct. 8, 2013

(54) TEST PREPARED INTEGRATED CIRCUIT WITH AN INTERNAL POWER SUPPLY DOMAIN

(75) Inventors: Rinze I. M. P. Meijer, Herkenbosch (NL); Sandeep Kumar Goel, San Jose, CA (US); Jose De Jesus Pineda De Gyvez, Eindhoven (NL)

(73) Assignee: NXP B.V., Eindhoven (NL)

( * ) Notice: Subject to any disclaimer, the term of this patent is extended or adjusted under 35 U.S.C. 154(b) by 982 days.

(21) Appl. No.: 11/911,732

(22) PCT Filed: Apr. 13, 2006

(86) PCT No.: PCT/IB2006/051168
§ 371 (c)(1),
(2), (4) Date: Sep. 30, 2009

(87) PCT Pub. No.: WO2006/111910
PCT Pub. Date: Oct. 26, 2006

(65) Prior Publication Data
US 2010/0013493 A1    Jan. 21, 2010

(30) Foreign Application Priority Data

Apr. 19, 2005 (EP) ..................................... 05103146

(51) Int. Cl.
*G01R 31/08* (2006.01)
(52) U.S. Cl.
USPC ............................ 324/527; 324/500; 324/416
(58) Field of Classification Search
None
See application file for complete search history.

(56) References Cited

U.S. PATENT DOCUMENTS

| | | | |
|---|---|---|---|
| 4,528,505 A | 7/1985 | Peterson | |
| 5,498,972 A | 3/1996 | Haulin | |
| 5,578,957 A * | 11/1996 | Erhart et al. | 327/333 |
| 6,417,672 B1 * | 7/2002 | Chong | 324/520 |
| 6,946,846 B2 * | 9/2005 | Corr | 324/537 |
| 7,102,254 B2 * | 9/2006 | Veendrick et al. | 307/126 |
| 2004/0104740 A1 | 6/2004 | Burns et al. | |

FOREIGN PATENT DOCUMENTS

| | | |
|---|---|---|
| EP | 1132744 A2 | 9/2001 |
| WO | 0122103 A1 | 3/2001 |

OTHER PUBLICATIONS

Masayuki Miyazaki; et al "An Autonomous Decentralized Low-Power System With Adaptive-Universal Control for a Chip Multi-Processor" 2003 IEEE International Solid-State Circuits Conference, San Francisco, CA. Feb. 10, 2003 pp. 109-109.

* cited by examiner

*Primary Examiner* — Patrick Assouad
*Assistant Examiner* — Trung Nguyen

(57) ABSTRACT

The integrated circuit (10) has an internal power supply domain with a power supply voltage adaptation circuit (14) to adapt the power supply voltage in the power supply domain. Typically, a plurality of such domains is provided wherein the power supply voltage can be adapted independently. During testing an internal power supply voltage is supplied to a temporally integrating analog to digital conversion circuit (16) in the integrating circuit (10). A temporally integrated value of the power supply voltage is measured during a measurement period. Preferably, integrating measurements of a plurality of internal supply voltages are performed in parallel during the same measurement time interval. Preferably a further test is performed by changing over between mutually different supply voltages during a further measurement period. In this way the measured integrated supply voltage can be used to check the speed of the change over between the different voltages.

13 Claims, 3 Drawing Sheets

TEST PREPARED INTEGRATED CIRCUIT WITH AN INTERNAL POWER SUPPLY DOMAIN

The invention relates to an integrated circuit that comprises an internal power supply domain and to testing of such an integrated circuit.

An integrated circuit with a plurality of power supply domains is described in an article by Masayuki Miyazaki et al, titled "An Autonomous Decentralized Low-Power System with Adaptive-Universal Control for a Chip Multi-Processor" and published in the Digest of technical Papers of the 2003 IEEE International Solid-State Circuits Conference, San Francisco, pages 109-109.

Masayuki Miyazaki et al describe how the power consumption of an integrated circuit can be reduced by using a plurality of power supply domains. The functional circuits of the integrated circuit are divided into a plurality of modules. Each has its own regulated power supply circuit for controlling the supply voltage and body bias voltage of the circuits in the module. In operation, these voltages are adapted dynamically for each module, dependent on the clock frequencies that are needed in the respective modules to process the data supplied to the modules.

Masayuki Miyazaki et al describe how the voltages required for the respective frequencies are determined during an initial chip testing phase by means of a Built In Self Test (BIST) circuit. This BIST circuit comprises an A/D converter arranged to output digitized measurements of the relevant voltages and a counter circuit arranged to count clock pulses until the digitized voltage values exceed a specified threshold value. The BIST circuit is arranged to check the measured voltage levels and voltage-transition intervals. Masayuki Miyazaki et al store the measured values in a Look Up Table memory (LUT) for use to select voltages that support as a function of the required clock frequencies. Masayuki Miyazaki et al disclose a centralized BIST circuit, and respective LUT's for the different modules. The centralized BIST circuit is coupled to the LUT's via a data bus of the integrated circuit. Masayuki Miyazaki et al do not disclose use of the A/D converters or the transition time measurements for fault testing. Masayuki Miyazaki et al merely suggest that measurements of transition times must be obtained starting from a plurality of discrete possible operating voltages for use in selection of optimal voltage during normal circuit operation.

International Patent Application No. WO 01/22103 discloses a method of testing oscillator circuits, in particular phase locked loop (PLL) circuits. In this method the frequency of the oscillator circuit is counted to obtain test measurements. Input voltages of the oscillator circuit are varied and the response of the frequency is measured. In one example, in a PLL with a phase detector, a filter and a VCO (Voltage Controller Oscillator), the PLL is broken open at the phase detector, test voltages are applied from the phase detector and the resulting VCO frequency is measured. This patent application is not concerned with testing of integrated circuits with a plurality of power supply domains.

Among others, it is an object of the invention to provide for testing of an integrated circuit with a power supply domains wherein a simple versatile circuit is used for test purposes.

The invention provides for a test prepared integrated circuit according to Claim 1. According to the invention the integrated circuit comprises a temporally integrating analog to digital conversion circuit with an input coupled to an internal power supply conductor and an output coupled to the test output. This makes it possible to obtain test information both about power supply voltage levels and transition times between power supply voltage levels. When a transition in the power supply voltage is started within a predetermined range of timing relationships with respect to the start of the integration time interval the integrated voltage depends on the speed of the transition. Typically the output result of the integrating analog to digital conversion circuit is fed to the test output via a scan chain, but alternatively an on-chip comparator circuit may be provided to determined whether the measured integration value or values are within predetermined ranges, or more particularly have predetermined values, a result of the comparison being fed to the test output. In an embodiment the integrated circuit comprises a plurality of power supply domains, with respective internal power supply conductors and a common control input arranged to control start of integration in each of the integrating analog to digital conversion circuits collectively. Thus power supply behavior on the plurality of power supply conductors can be tested quickly, with common integration time intervals. If a central voltage measuring circuit would be used, integration time intervals would have to be provided successively for different power supply domains. By using such a plurality of integrating circuits a common integration time interval can be used. Preferably the test control circuit provides for independent control of the power supply voltages, or transitions therein for different power supply conductors during testing. Thus different tests can be performed in parallel.

In an embodiment the integrating analog to digital conversion circuit comprises a voltage controlled oscillator with a frequency control input coupled to the power supply conductor and an oscillator output, a frequency counter with an input coupled to the oscillator output and a count output coupled to the test output. Thus a simple and reliable integrating power supply measuring circuit can be realized.

In an embodiment the integrated circuit has an externally accessible terminal for controlling a duration of the integration time interval. In an alternative embodiment an on-chip test control circuit controls the duration of the integration time interval.

Preferably, an on chip test control circuit causes the integrating analog to digital conversion circuit to start integration and a power supply voltage adaptation to make a change in the power supply voltage in a predetermined timing relationship with the start of integration in response to a test command. In a method of testing an activity dependence of the supply voltage is measured, by sending control signals to the logic circuits that draw current from a power supply conductor to cause a selected activity in the logic circuits during integration.

These and other objects and advantageous aspects of the invention will be described by means of non-limitative examples in the accompanying figures.

FIG. 1 schematically shows an integrated circuit

Figure 7:
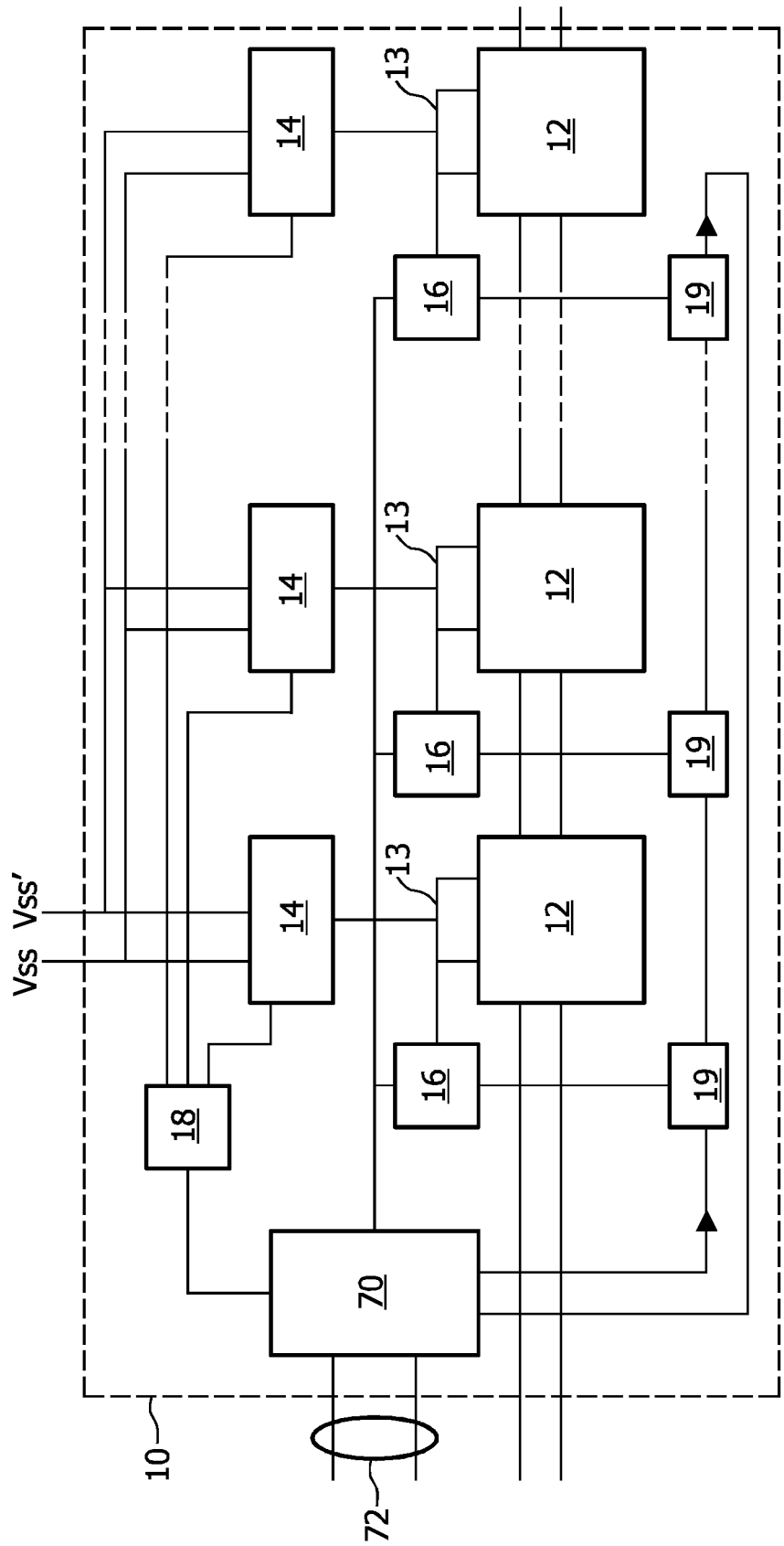

FIG. 7 schematically shows an embodiment of the integrated circuit

Figure 1:
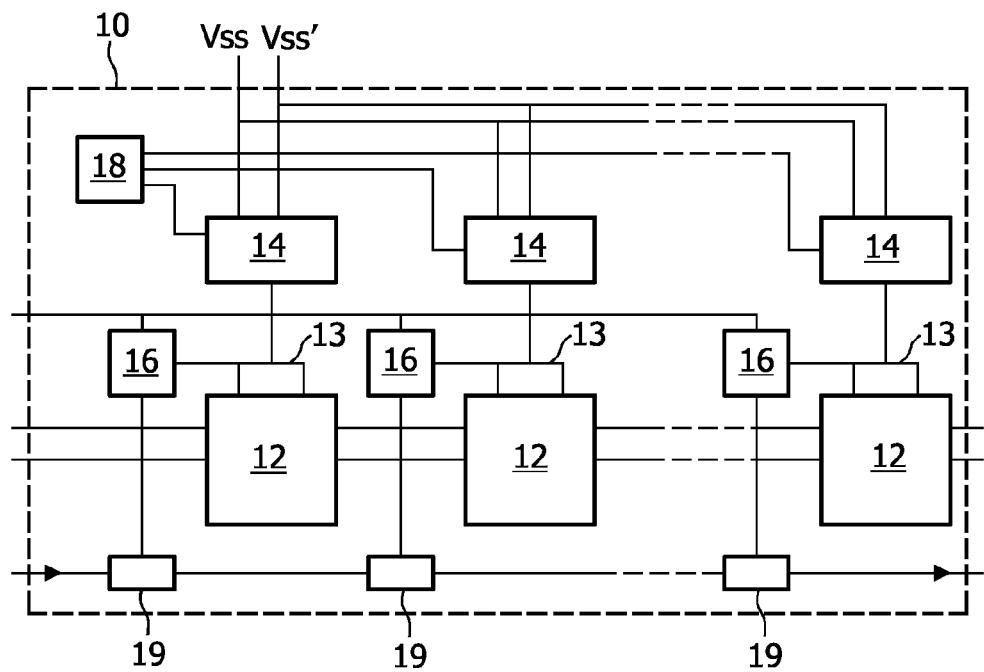

FIG. 1 schematically shows an integrated circuit 10 with a power supply connections Vss, Vss', a plurality of logic circuit blocks 12, power supply voltage adaptation circuits 14, integrating analog to digital conversion circuits 16, a voltage selection circuit 18 and a plurality of scan registers 19. Power supply voltage adaptation circuits 14 are coupled to power supply connections Vss, Vss'. The integrated circuit comprises internal power supply conductors 13 coupled from respective ones of power supply voltage adaptation circuits 14 to power supply terminals of corresponding ones of logic circuit blocks 12. Logic circuit blocks 12 may contain combinatorial logic circuits as well as storage elements.

Integrating analog to digital conversion circuits 16 have inputs coupled to respective ones of internal power supply conductors 13 and outputs coupled to scan registers 19. Scan registers are coupled in a shift register chain for outputting data from integrating analog to digital conversion circuits 16. Additional scan registers (not shown) coupled to other parts of integrated circuit 10 may be part of the scan chain. Integrating analog to digital conversion circuits 16 have control inputs to control an integration time interval.

Typically, logic circuit blocks 12 are mutually interconnected for passing data and/or connected to pins of integrated circuit 10 for inputting and/or outputting data. By way of example the figure shows some connections for this purpose, but the invention is by no means limited to this example. Typically, logic circuit blocks 12 will contain level shifting circuits (not shown) at their inputs and/or outputs to shift the logic voltage levels dependent on the logic voltages used by the respective logic circuit blocks 12.

In normal operation power supply voltage adaptation circuits 14 adapt the power supply voltage that is applied to power supply conductors 13 under control of voltage selection circuit 18, according to operating circumstances of the respective logic circuit blocks 12. The power supply voltage to a logic circuit block 12 is lowered for example for those logic circuits blocks 12 that can operate at low speed, or need to retain data only, without performing logic functions. Similarly, the power supply voltage to a logic circuit block 12 may be raised for logic circuits blocks 12 when they must operate at higher speed, or start receiving changing signals. Typically voltage selection circuit 18 has inputs (not shown) for receiving information about intended activities in the integrated circuit. On the basis of this information voltage selection circuit 18 selects the required voltages and sends resulting selection signals to power supply voltage adaptation circuits 14. The way in which is done does not affect the invention.

After manufacture of integrated circuit 10 and/or after installation of the integrated circuit on a circuit board or in an apparatus, integrated circuit 10 is tested to detect faults that would compromise normal operation. Possible faults include the possibility that the voltages from power supply voltage adaptation circuits 14 are too high or too low, or that the changeover between one voltage too another is too slow, or that the output impedance of power supply voltage adaptation circuits 14 is too high, so that the voltage will drop too much when the corresponding logic circuit block 12 draws considerable current.

Figure 2:
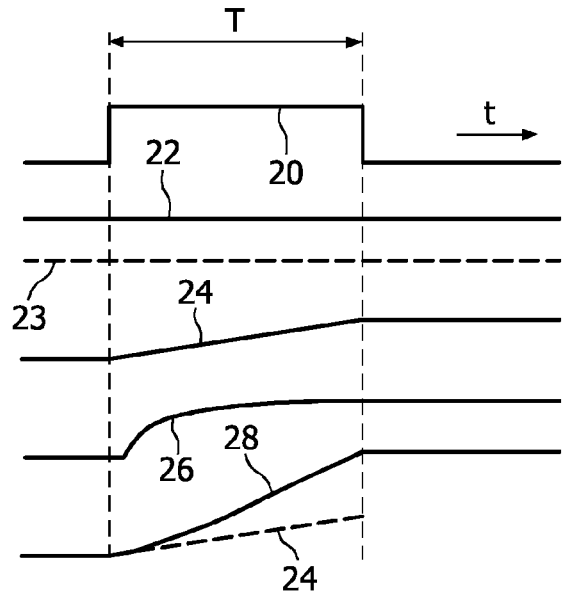
FIG. 2 shows signals for testing

FIG. 2 illustrates test operation. During test operation a control signal 20 is applied to integrating analog to digital conversion circuits 16. Control signal 20 defines a measurement time interval T. In time interval time T integrating analog to digital conversion circuits 16 integrate the voltages from power supply conductors 13. Thus, the effect S of the power supply voltage V(t) as a function of time "t" on the output signal of integrating analog to digital conversion circuits 16 is proportional to $$S=\text{integral of } V(t) \text{ over time t during time interval } T$$

During a first test, voltage selection circuit 18 signals to power supply voltage adaptation circuits 14 that that the voltage level 22 (shown relative to a reference level 23) from before time interval T should be maintained during time interval T. As a result the effect S on the integrated voltage 24 rises steadily during time interval T in integrating analog to digital conversion circuits 16 during this first test. This test is used to check the level if the voltage.

During a second test voltage selection circuit 18 signals to power supply voltage adaptation circuits 14 to change the voltage level at a predetermined time point relative to the start of time interval T, typically at the start of time interval T. This results in a changing voltage 26 at power supply conductor 13. As a result the effect S of the integrated signal 28 in integrating analog to digital conversion circuits 16 starts rising more sharply (or less, dependent on the direction of the change), in comparison to the contribution 24 that would obtain for a constant voltage.

It should be noted that the effect S during the second test depends on the transition time of the change from one voltage level to another, as well as on the actual levels. With decreasing transition times the voltage level after the change contributes more strongly to the effect S and vice versa. Thus, for given voltage levels before and after the change, the integrated effect S of the change is a measure of the transition time. As used herein the term integrating analog to digital conversion circuit also covers embodiments wherein a non-linear function of the power supply voltage V is integrated. As can be appreciated, if the function is known, information about the voltages and the transition time can readily be obtained from such an integration. Moreover, it may be noted that as used herein integrating also covers temporal averaging of such a function or the power supply over time interval T.

Figure 3:
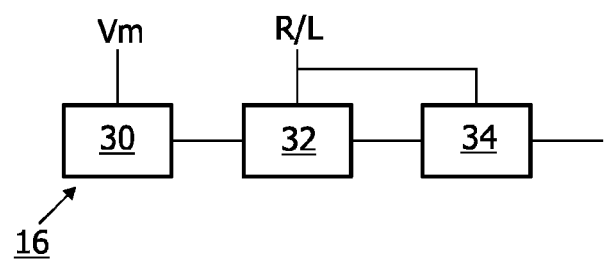
FIG. 3 shows an integrating analog to digital conversion circuit

FIG. 3 shows an embodiment of an integrating analog to digital conversion circuit 16. The circuit contains a voltage-controlled oscillator 30, a counter 32 and a register 34. Voltage controlled oscillator has a frequency control input Vm coupled to a power supply conductor 13 (not shown) and an oscillator output coupled to a counter input of counter 32. Counter 32 has a count output coupled to register 34. A control input of integrating analog to digital conversion circuit 16 is coupled to a reset input of counter 32 and a load input of register 34, so that counter 32 will be reset at the start of time interval T and a count from counter 32 will be loaded into register 34 after the end of time interval T. Thus, if the frequency F of local oscillator 30 is a function F(V) of the voltage V at power supply conductor 13 the count C in counter 32 at the end of time interval T is approximately $$C=\text{integral } F(V(t)) \text{ integrated over time t during time interval } T$$

Thus, the circuit of FIG. 3 serves as an integrating analog to digital conversion circuit 16. Typically, the function F(V) is approximately linear in the voltage range used, in which case the integral is approximately proportional to $$\text{integral } V(t) \text{ integrated over time t during time interval } T$$

However, as used herein the term integrating analog to digital conversion circuit also covers embodiments wherein F(V) is not linear.

Voltage controlled oscillator 30 is implemented for example as a ring oscillator (e.g. an odd number of digital inverter circuits (not shown) coupled in a loop) that receives a power supply voltage from power supply conductor 13. The oscillation frequency of such a circuit depends on the extent to which the power supply voltage exceeds the threshold voltage of the transistors in the ring oscillator. In an embodiment (not shown) the control input of analog to digital conversion circuit 16 is also coupled to voltage controlled oscillator 30, to disable voltage controlled oscillator when no test is performed. Thus, power consumption is reduced and possible interference from voltage controlled oscillator 30 is avoided.

Counter 32 may be a ripple counter, or any other convenient type of counter. Preferably, counter 32 also receives its power supply from the power supply conductor 13 that it is used to test. Thus, analog to digital conversion circuit 16 for one internal power supply conductor 13 can be used independent of the power voltages of other power supply conductors 13, which speeds up testing. Register 34 may be one of the scan registers, or a separate register with an output coupled to an input of a scan register for loading test results.

Figure 4:
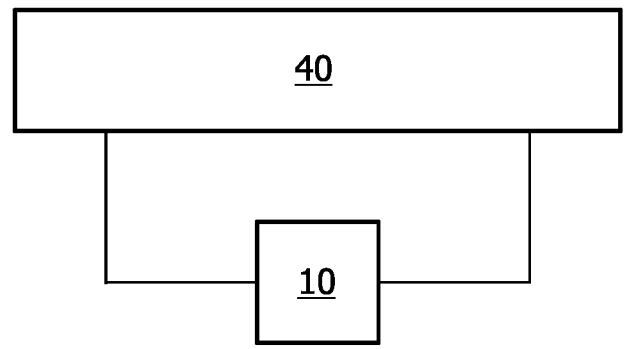
FIG. 4 shows a test system

FIG. 4 shows a test system comprising a test apparatus 40 coupled to integrated circuit. Test apparatus 40 has one or more outputs coupled to integrated circuit 10, for supplying test command, test patterns and test timing signals. Test apparatus has an input coupled to an output of integrated circuit 10 for receiving test results.

Figure 5:
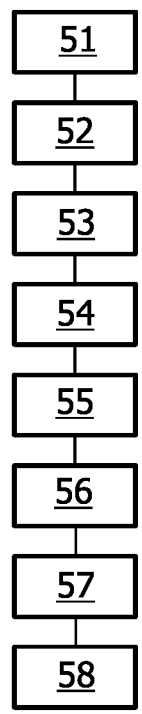
FIG. 5 shows flow chart of a test process

FIG. 5 shows a flow chart of the operation of the test system. In a first step 51 test apparatus 40 applies signals to integrated circuit 10 to make integrated circuit 10 enter a test mode. In a second step 52 test apparatus 40 applies signals to integrated circuit 10 to make power supply voltage adaptation circuits 14 output selected voltages.

In a third step 53 test apparatus 40 applies signals to integrated circuit 10 to make integrating analog to digital conversion circuit 16 integrate the voltage over time interval T. Preferably, this time interval T is defined by signals from test apparatus 40 (e.g. directly by means of a pulse applied to an input of integrated circuit 10, or by means of a number of clock periods of a test clock signal applied to integrated circuit 10). Alternatively, the duration of the time interval may be defined by an internal timer circuit in integrated circuit 10.

In a fourth step 54 test apparatus 40 applies signals to integrated circuit 10 to shift the result if the integrated measurement out of integrated circuit 10 to test apparatus 40 for inspection. Second step 52, third step 53 and fourth step 54 may be repeated a number of times for different voltage settings. Optionally, shifting in fourth step 54 is performed so that after testing at each voltage test results are shifted only as far as needed to make room for new results, so that eventually results for a plurality of voltages are shifted out together.

In a fifth step 55 test apparatus 40 applies signals to integrated circuit 10 to make power supply voltage adaptation circuits 14 output selected voltages. In a sixth step 56 test apparatus 40 applies signals to integrated circuit 10 to make integrating analog to digital conversion circuit 16 integrate the voltage over time interval T. Synchronized with the start of the time interval test apparatus 40 applies signals to make power supply voltage adaptation circuits 14 change the voltages. These signals may be applied as command signals supplied to integrated circuit, and integrated circuit 10 may be arranged to effect the commands in response to the same timing signal that starts the time interval. Alternatively test apparatus 40 and integrated circuit may be arranged so that timing signals are applied by test apparatus from outside integrated circuit 10 to trigger the start of a voltage transition. At the end of time interval integrated circuit 10 captures the results.

Although a form of synchronization is preferred in which there is a predetermined timing relationship between the start of integration and the start of the power supply voltage transition (preferably substantially at the start of integration, as this results in maximum sensitivity to transition speed), it should be realized that a predetermined timing relationship is not necessary. If the entire transition is within the integration time interval T, the resulting integrated power supply voltage value depends on the transition speed, but not on the starting time. Therefore, as long as the timing relationship is within a predetermined range consistent test results will be obtained.

xxx numerical examples of T and of power supply voltages that will be tested In a seventh step 57 test apparatus 40 applies signals to integrated circuit 10 to shift the result if the integrated measurement out of integrated circuit 10 to test apparatus 40 for inspection. Fifth to seventh steps may be repeated a number of times for different voltage transitions.

In an eight step 58 test apparatus evaluates the results, to determine whether the measured integrated voltages of third step 53 are within ranges that correspond to acceptable voltages and to determine whether the measured integrated voltages of sixth step 56 are within ranges that correspond to acceptable transition times. If not, integrated circuit 10 is rejected.

In a further embodiment the comparison whether the results are within acceptable ranges are performed inside integrated circuit 10.

Figure 6:
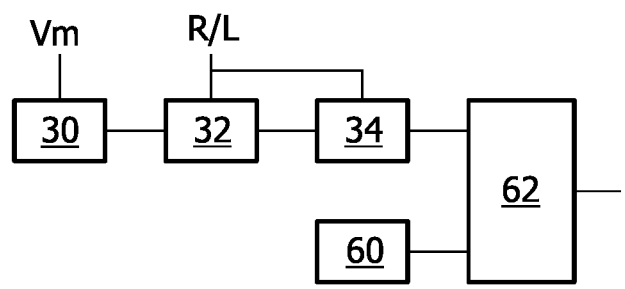
FIG. 6 shows a further integrating analog to digital conversion circuit

FIG. 6 shows a further embodiment of integrating analog to digital conversion circuit 16. This further embodiment contains a reference circuit 60 and a comparator circuit 62. Comparator circuit compares results from register 34 with reference values from reference circuit 60 and supplies comparison results to the scan chain for output to test apparatus. In an embodiment reference circuit 60 represents a plurality of reference values, for measurements at different voltages, reference circuit 60 being controlled by the same circuits that control selection of the reference voltage, to output a corresponding reference value. Similarly, reference circuit 60 may represent a one or more reference values, for measurements of one or more voltage transitions, reference circuit 60 being controlled by the same circuits that control selection of the transition or transitions, to output a corresponding reference value. In this way the time needed for shifting out test results is minimized. In the embodiment of FIG. 6 the integrated voltage output of integrating analog to digital conversion circuit 16 is coupled to the test output via comparator circuit 62 and the scan chain. No separate coupling to the test output, bypassing comparator circuit 62, is needed. But alternatively such a separate coupling may be provided and activated under control of selected test commands, so that access to integrated voltage measurements can be made available on command.

FIG. 7 shows an embodiment of integrated circuit 10 wherein a test control circuit 70 is included in integrated circuit 10, coupled to an externally accessible test interface 72 of the integrated circuit. In this embodiment test control circuit 70 has an output coupled to integrating analog to digital conversion circuit 16 for controlling the start and end of time interval T and an output coupled to voltage selection circuit 18 for controlling the application of power supply voltages (or changes therein) during the test (alternatively, test control circuit 70 may be coupled directly to power supply voltage adaptation circuits 14, to control the voltages without the intervention of the voltage selection circuit 18 that is used to select the voltages during normal (non-test) operation).

In operation test control circuit 70 receives test commands via interface 72. Architectures for receiving and executing test commands are known per se. In response to a particular test command test control circuit 70 signals integrating analog to digital conversion circuits 16 to start integration and one or more power supply voltage adaptation circuits 14 to start a change of the power supply voltage in a predetermined timing relationship with the start of integration. Subsequently, test control circuit signals the end of integration. For this purpose, part of test control circuit may contain a timer circuit to define the duration of integration, or test control circuit 70 may derive the duration from clock signals received at test interface 72. Preferably, test control circuit is arranged to control the power supply voltages applied to the internal power supply conductors independently of one another, or preferably at least to control the voltages to which a transition is made in response to the test command, for example dependent on test data supplied via test interface 72. Preferably the described tests are performed while logic circuit blocks 12 are inactive (cause no internal signal transitions). In a further embodiment an additional test is performed which includes causing signal transitions in a logic circuit block 12 while the power supply voltage is integrated for test purposes. In this further embodiment a succession of test patterns provided by test apparatus may be applied to logic circuit block 12 in the time interval T. Preferably, pairs of successive test patterns are used that result in a considerable number of signal transitions in the logic circuit block 12. If the voltage level at internal power supply conductor 13 is strongly influenced by such transitions, this will show up in the integrated value.

Many types of voltage analog to digital conversion circuits produce digital output results that depend on circuit temperature in addition to circuit voltage. This can be used to test temperature local development in the circuit, by measuring the integrated voltages of integrating voltage measurement circuit at different locations in the circuit in parallel, while logic circuits 12 are caused to perform activities that may cause heat dissipation in a some spatial pattern. Although the embodiment with a voltage controlled oscillator and a counter is a preferred embodiment of integrating analog to digital conversion circuit 16, it should be realized that other embodiments are possible. In one alternative embodiment an analog integrating circuit may be used, followed by an analog to digital converter circuit. The integrating circuit is reset at the start of time interval T and its output signal at the end of time interval is converted to a digital value. However, such a solution is more complex and susceptible to noise and temperature effects.

In another alternative embodiment an analog to digital converter circuit followed by a digital summing circuit may be used. The output signals of the converter during the time interval T are digitally summed. However, such a solution is more complex. In another alternative embodiment a voltage controlled delay circuit and a counter are used. In this embodiment a signal is sent into the delay circuit at the start of measurement and the voltage from power supply conductor 13 is used to control the delay. The counter counts the delay incurred by the signal and outputs this signal as the integrated measurement. It may be noted that the time interval of measurement does not have a predetermined duration in this case. However, such a solution requires a high frequency counter and/or a long delay line.

The invention claimed is:

1. A test prepared integrated circuit with an internal power supply domain, the integrated circuit comprising; an internal power supply conductor for said power supply domain; a power supply voltage adaptation circuit, for selectably adapting a power supply voltage on the internal power supply conductor; a test output; an integrating analog to digital conversion circuit with an input coupled to the power supply conductor and an output coupled to the test output.

2. A test prepared integrated circuit according to claim 1, comprising a plurality of power supply domains, with respective internal power supply conductors, power supply voltage adaptation circuits and integrating analog to digital conversion circuits for each power supply domain or groups of power supply domains, and a common control input arranged to control start of integration in each of the integrating analog to digital conversion circuits collectively.

3. A test prepared integrated circuit according to claim 1, comprising a scan chain with a scan output coupled to the test output, the output of the integrating analog to digital conversion circuit being coupled to the test output via the scan chain.

4. A test prepared integrated circuit according to claim 1, wherein the integrating analog to digital conversion circuit comprises a voltage controlled oscillator with a frequency control input coupled to the power supply conductor and an oscillator output, a counter with an input coupled to the oscillator output and a count output coupled to the test output.

5. A test prepared integrated circuit with an internal power supply domain, comprising:
   an internal power supply conductor for said power supply domain; a power supply voltage adaptation circuit, for selectably adapting a power supply voltage on the internal power supply conductor; a test output; an integrating analog to digital conversion circuit with an input coupled to the power supply conductor and an output coupled to the test output;
   a plurality of power supply domains, with respective internal power supply conductors, power supply voltage adaptation circuits and integrating analog to digital conversion circuits for each power supply domain or groups of power supply domains, and a common control input arranged to control start of integration in each of the integrating analog to digital conversion circuits collectively;
   a plurality of power supply domains, with respective internal power supply conductors, power supply voltage adaptation circuits and integrating analog to digital conversion circuits for each power supply domain or groups of power supply domains, and a common control input arranged to control start of integration in each of the integrating analog to digital conversion circuits collectively; and
   a test control circuit arranged to cause control signals for independently selectable power supply voltage transitions to be sent to at least part of the power supply voltage adaptation circuits within a predetermined relative timing range with respect to the start of integration.

6. A test prepared integrated circuit with an internal power supply domain, the integrated circuit comprising;
   an internal power supply conductor for said power supply domain; a power supply voltage adaptation circuit, for selectably adapting a power supply voltage on the internal power supply conductor; a test output;
   an integrating analog to digital conversion circuit with an input coupled to the power supply conductor and an output coupled to the test output; and
   an externally accessible terminal coupled to a control input of the integrating analog to digital conversion circuit, for supplying a duration signal that controls a duration of an integration time interval of the integrating analog to digital conversion circuit.

7. A test prepared integrated circuit with an internal power supply domain, the integrated circuit comprising;
   an internal power supply conductor for said power supply domain; a power supply voltage adaptation circuit, for selectably adapting a power supply voltage on the internal power supply conductor;
   a test output; an integrating analog to digital conversion circuit with an input coupled to the power supply conductor and an output coupled to the test output; and
   a test control circuit with an internal timing circuit arranged to generate a duration signal and coupled to a control input of the integrating analog to digital conversion circuit, for supplying the duration signal to controls a duration of an integration time interval of the integrating analog to digital conversion circuit.

8. A test prepared integrated circuit with an internal power supply domain, the integrated circuit comprising;

an internal power supply conductor for said power supply domain; a power supply voltage adaptation circuit, for selectably adapting a power supply voltage on the internal power supply conductor;

a test output; an integrating analog to digital conversion circuit with an input coupled to the power supply conductor and an output coupled to the test output; and a test control circuit having an input for receiving test commands, and outputs coupled to the integrating analog to digital conversion circuit and the power supply voltage adaptation circuit, the test control circuit being arranged to cause the integrating analog to digital conversion circuit to start integration and to cause the power supply voltage adaptation circuit to make a change in the power supply voltage with a relative timing within a predetermined range with respect to the start of integration in response to a test command.

9. A test prepared integrated circuit with an internal power supply domain, the integrated circuit comprising;

an internal power supply conductor for said power supply domain; a power supply voltage adaptation circuit, for selectably adapting a power supply voltage on the internal power supply conductor;

a test output; an integrating analog to digital conversion circuit with an input coupled to the power supply conductor and an output coupled to the test output; and a reference value generator circuit and a comparator circuit, the comparator circuit having inputs coupled to the output of the integrating analog to digital conversion circuit and an output of the reference value generator circuit, the comparator circuit having an output coupled to the test output.

10. A method of testing an integrated circuit that comprises an internal power supply domain with a power supply voltage adaptation circuit to adapt the power supply voltage in the power supply domain, the method comprising of; applying the power supply voltage to an integrating analog to digital conversion circuit in the integrating circuit; measuring an integrated value of the power supply voltage, by maintaining a selected supply voltage during a measurement period, and reading an output signal established by the integrating analog to digital conversion circuit by temporal integration in the integrated circuit during the measurement period.

11. A method of testing an integrated circuit that comprises an internal power supply domain with a power supply voltage adaptation circuit to adapt the power supply voltage in the power supply domain, the method comprising of; applying the power supply voltage to an integrating analog to digital conversion circuit in the integrating circuit; measuring an integrated value of the power supply voltage, by maintaining a selected supply voltage during a measurement period, and reading an output signal established by the integrating analog to digital conversion circuit by temporal integration in the integrated circuit during the measurement period; and measuring information about a supply voltage transition time, by sending control signals to the power supply voltage adaptation circuit to change over between mutually different supply voltages during a further measurement period and reading a further output signal established by the integrating analog to digital conversion circuit by temporal integration in the integrated circuit during the second measurement period.

12. A method of testing an integrated circuit that comprises an internal power supply domain with a power supply voltage adaptation circuit to adapt the power supply voltage in the power supply domain, the method comprising of; applying the power supply voltage to an integrating analog to digital conversion circuit in the integrating circuit; measuring an integrated value of the power supply voltage, by maintaining a selected supply voltage during a measurement period, and reading an output signal established by the integrating analog to digital conversion circuit by temporal integration in the integrated circuit during the measurement period; and measuring an integrated value of the power supply voltages of a plurality of respective power supply voltage domains, by maintaining selected supply voltages in the respective power supply domains during the measurement period, and reading an output signal established by respective integrating analog to digital conversion circuits that temporally integrated the power supply voltages of respective ones of the power supply domains in the integrated circuit during the measurement period.

13. A method of testing an integrated circuit that comprises an internal power supply domain with a power supply voltage adaptation circuit to adapt the power supply voltage in the power supply domain, the method comprising of; applying the power supply voltage to an integrating analog to digital conversion circuit in the integrating circuit; measuring an integrated value of the power supply voltage, by maintaining a selected supply voltage during a measurement period, and reading an output signal established by the integrating analog to digital conversion circuit by temporal integration in the integrated circuit during the measurement period; and, wherein the integrated circuit comprises logic circuits with power supply connections coupled to the power supply voltage adaptation circuit, the method comprising measuring an activity dependence of the supply voltage, by sending a control signal to the power supply voltage adaptation circuit to maintain a selected supply voltage during the measurement period, and further control signals to the logic circuits to cause a selected activity in the logic circuits during the measurement period.

* * * * *